(12) United States Patent
Sakashita et al.

(10) Patent No.: US 12,300,499 B2
(45) Date of Patent: May 13, 2025

(54) POLISHING SOLUTION, POLISHING APPARATUS, AND POLISHING METHOD

(71) Applicant: Kioxia Corporation, Tokyo (JP)

(72) Inventors: Mikiya Sakashita, Nagoya Aichi (JP); Yukiteru Matsui, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 806 days.

(21) Appl. No.: 17/447,343

(22) Filed: Sep. 10, 2021

(65) Prior Publication Data
US 2022/0290009 A1 Sep. 15, 2022

(30) Foreign Application Priority Data
Mar. 12, 2021 (JP) .................. 2021-040133

(51) Int. Cl.
H01L 21/306 (2006.01)
B24B 1/00 (2006.01)
B24B 37/015 (2012.01)
B24B 37/04 (2012.01)
B24B 37/10 (2012.01)
B24B 41/06 (2012.01)
C09G 1/02 (2006.01)
C09G 1/18 (2006.01)
H01L 21/321 (2006.01)

(52) U.S. Cl.
CPC .......... *H01L 21/30625* (2013.01); *B24B 1/00* (2013.01); *B24B 37/015* (2013.01); *B24B 37/044* (2013.01); *B24B 37/107* (2013.01); *B24B 41/068* (2013.01); *C09G 1/02* (2013.01); *C09G 1/18* (2013.01); *H01L 21/3212* (2013.01)

(58) Field of Classification Search
None
See application file for complete search history.

(56) References Cited

U.S. PATENT DOCUMENTS

| 2008/0051008 | A1* | 2/2008 | Economikos | ........... B24B 1/005 451/41 |
|---|---|---|---|---|
| 2013/0217228 | A1 | 8/2013 | Kodera et al. | |
| 2016/0122591 | A1 | 5/2016 | Tsuchiya et al. | |
| 2017/0184958 | A1 | 6/2017 | Kawamura et al. | |
| 2021/0298814 | A1 | 9/2021 | Garrison | |
| 2021/0299814 | A1 | 9/2021 | Garrison | |

FOREIGN PATENT DOCUMENTS

| CN | 109096923 A | 12/2018 |
|---|---|---|
| JP | 2007-296598 A | 11/2007 |
| JP | 2014-87900 A | 5/2014 |
| JP | 2017-118062 A | 6/2017 |

(Continued)

OTHER PUBLICATIONS

P. Soares, et al., "Thermal and magnetic properties of iron oxide colloids: influence of surfactants," Nanotechnology, vol. 26, No. 425704, 11 pages (2015).

*Primary Examiner* — Jiong-Ping Lu
(74) *Attorney, Agent, or Firm* — Finnegan, Henderson, Farabow, Garrett & Dunner, LLP

(57) ABSTRACT

A polishing solution according to an embodiment includes an exothermic agent that generates heat through application of an alternating magnetic field thereto, and a viscosity modifier that undergoes a reversible phase transition between a gel state and a sol state depending on temperature.

6 Claims, 9 Drawing Sheets

(56) References Cited

FOREIGN PATENT DOCUMENTS

| JP | 6162417 B2 | 7/2017 |
| JP | 6360108 B2 | 7/2018 |
| JP | 2020-52315 A | 4/2020 |
| JP | 2021-151670 A | 9/2021 |
| WO | WO 2014/103284 A1 | 7/2014 |

* cited by examiner

POLISHING SOLUTION, POLISHING APPARATUS, AND POLISHING METHOD

CROSS-REFERENCE TO RELATED APPLICATION

This application is based upon and claims the benefit of priority from Japanese Patent Application No. 2021-040133, filed on Mar. 12, 2021, the entire contents of which are incorporated herein by reference.

FIELD

Embodiments described herein relate generally to a polishing solution, a polishing apparatus, and a polishing method.

BACKGROUND

In manufacture of a semiconductor device such as a NAND flash memory, a substrate is polished by a method called chemical-mechanical polishing (CMP) to flatten a surface of the substrate. In the chemical-mechanical polishing, while a surface of the substrate, which is the object to be polished, is in contact with a polishing cloth on a polishing table, the substrate and the polishing cloth are relatively moved so that the surface of the substrate is polished. During polishing, a polishing solution is supplied to the polishing cloth. The surface of the substrate is thereby chemically and mechanically polished and flattened.

DETAILED DESCRIPTION

Figure 1:
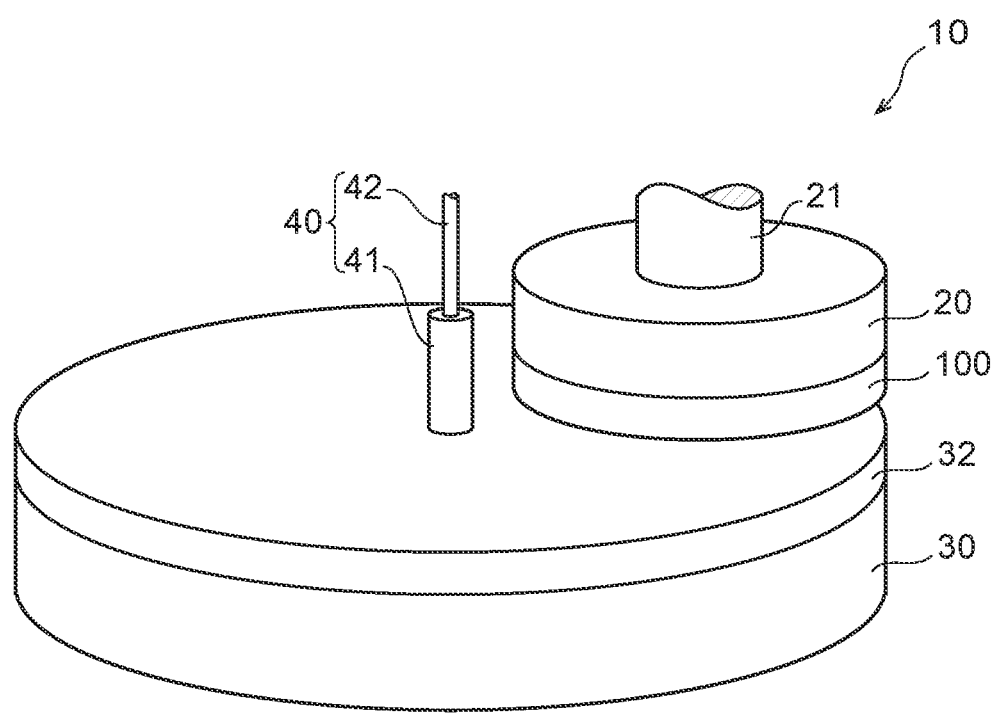
FIG. 1 is a schematic view illustrating a configuration of a polishing apparatus according to an embodiment.

Hereinafter, an embodiment will be described with reference to the accompanying drawings. To facilitate understanding of the description, the same components are given the same reference numerals throughout the drawings as much as possible and redundant descriptions thereof are omitted.

A polishing apparatus 10 according to the present embodiment is used in a manufacturing process of a semiconductor device such as a NAND flash memory, and its object to be polished is a substrate such as a silicon wafer.

In such a semiconductor device manufacturing process, convex defects and foreign substances may be formed on a surface of a substrate subjected to deposition or an etching process. When additional deposition is performed on the defects and foreign substances, the areas influenced by the defects are extended due to the so-called "lens effect", which may cause problems such as yield reduction and focus errors in an optical lithography step. Particularly in the field of semiconductor storage devices, the above-mentioned problems have become more serious with prevalence of three-dimensional structures. In addition, the convex defects and foreign substances on the surface of the substrate may influence not only a subsequent deposition step but also a lithography step with nanoimprint.

Accordingly, in the semiconductor device manufacturing process, for example, a step is generally provided in which the substrate subjected to deposition or patterning is polished to remove the convex defects and foreign substances. A polishing apparatus 10 according to the present embodiment is used for such a purpose, and is configured to polish a substrate by a method called chemical-mechanical polishing (CMP).

Figure 2:
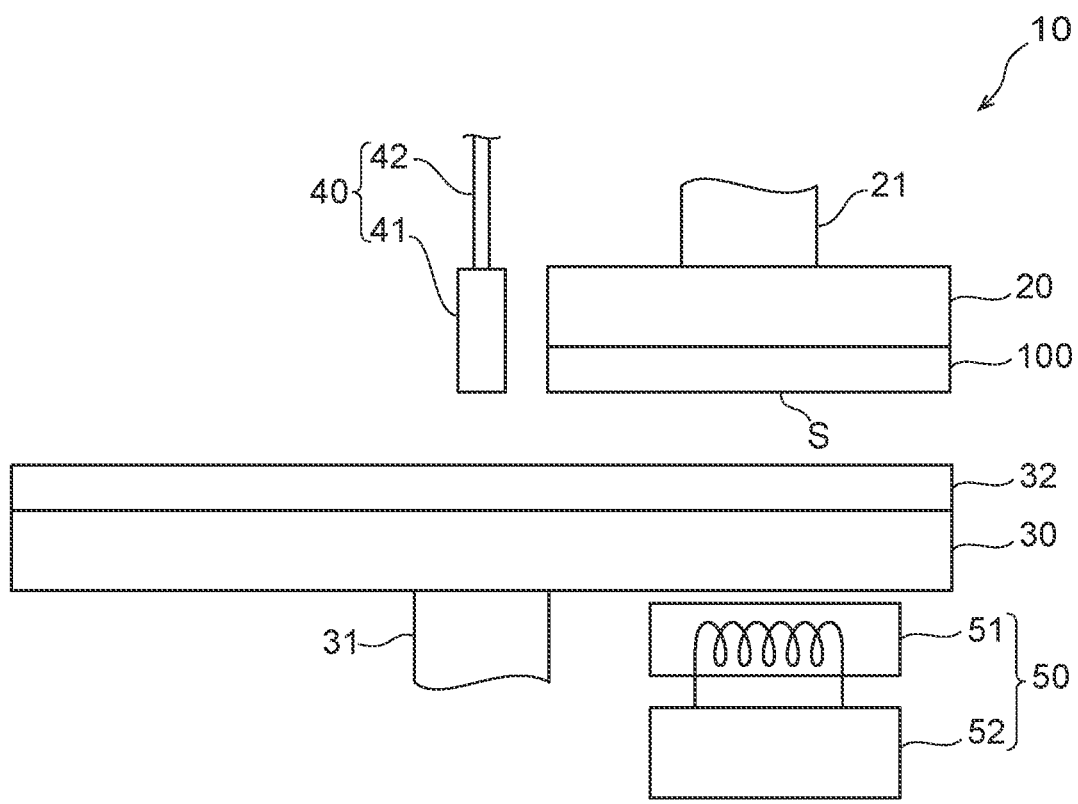
FIG. 2 a schematic view illustrating the configuration of the polishing apparatus according to the embodiment.

A configuration of the polishing apparatus 10 will be described with reference mainly to FIG. 1 and FIG. 2. FIG. 1 is a perspective view schematically illustrating a configuration of the polishing apparatus 10, and FIG. 2 is a side view schematically illustrating the configuration. The polishing apparatus 10 includes a holding unit 20, a polishing table 30, a supply unit 40, and a temperature raising unit 50.

The holding unit 20 holds a substrate 100, which is an object to be polished. The holding unit 20 has a generally circular plate shape, and is configured to hold the substrate 100 from the upper side. The holding unit 20 is configured as, for example, a mechanical chuck or a vacuum chuck. The substrate 100 is held from the upper side by the holding unit 20 with a surface S to be polished facing downward.

On the upper surface side of the holding unit 20, a drive shaft 21 is provided. The drive shaft 21 is a cylindrical shaft integrated with the holding unit 20. The drive shaft 21 is connected to a holding-unit driving device (not illustrated). When the drive shaft 21 is rotated around its central axis by the holding-unit driving device, the holding unit 20 is rotated together with the substrate 100.

Figure 3:
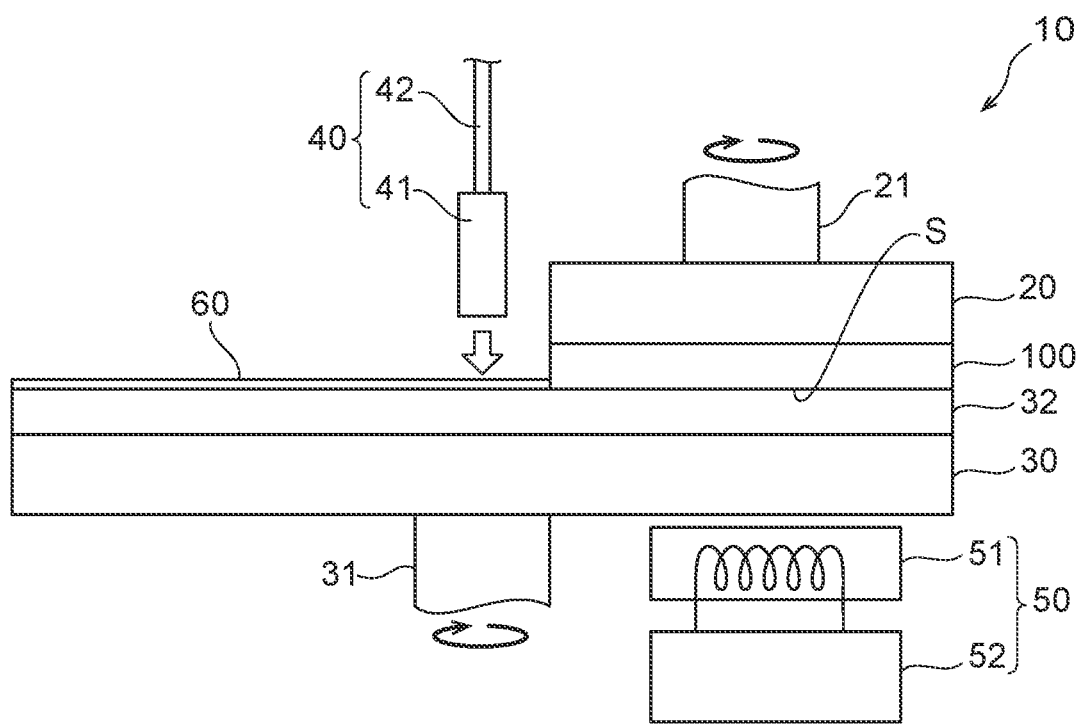
FIG. 3 a schematic view illustrating a state where polishing is being performed by the polishing apparatus.

The holding unit 20 can travel in the vertical direction. Before the substrate 100 is attached to the holding unit 20, the holding unit 20 is moved upward, as shown in FIG. 1 and FIG. 2. After the substrate 100 is attached to the holding unit 20 and before polishing of the substrate 100 is started, the holding unit 20 is moved downward so that the substrate 100 is in contact with a polishing cloth 32 (described later) as illustrated in FIG. 3.

The polishing table 30 is a generally circular plate-shaped portion disposed to face the holding unit 20. On the lower side of the polishing table 30, a drive shaft 31 is provided. The drive shaft 31 is a cylindrical shaft integrated with the polishing table 30. The drive shaft 31 is connected to a table driving device (not illustrated). When the drive shaft 31 is rotated around its central axis by the table driving device, the polishing table 30 is rotated together with the polishing cloth 32.

The polishing cloth 32 is a component configured to be brought into contact with the surface S to be polished of the substrate 100 to polish the substrate 100, and is disposed along the upper surface of the polishing table 30. The polishing cloth 32 is also referred to as a "polishing pad" and is made of, for example, polyurethane. The polishing table 30 having such a polishing cloth 32 can be described to be a portion configured to bring the polishing cloth 32 into contact with the substrate 100, which is the object to be polished, to polish the substrate 100.

When the substrate 100 is polished, the holding unit 20 and the substrate 100 are rotated by the holding-unit driving device and the polishing table 30 and the polishing cloth 32 are rotated by the table driving device. The rotation speed or the like in each rotation can be controlled independently of each other.

The supply unit 40 supplies a polishing solution 60 (see FIG. 4) to the upper surface of the polishing cloth 32. The supply unit 40 has a nozzle 41 and piping 42. The nozzle 41 discharges the polishing solution 60 toward the polishing cloth 32. The piping 42 supplies the polishing solution 60 to the nozzle 41. The end of the piping 42 opposite to the nozzle 41 is connected to a supply device (not illustrated) that feeds the polishing solution 60 by air pressure. The supply device enables adjustment of, for example, the flow rate of the polishing solution 60 discharged from the nozzle 41.

The temperature raising unit 50 applies an alternating magnetic field to the polishing solution 60 supplied to the polishing cloth 32. The temperature raising unit 50 has a coil 51 and a power supply 52.

The coil 51 generates an alternating magnetic field by an alternating current supplied from the power supply 52. The coil 51 is disposed in a position directly below the polishing table 30 and directly below the holding unit 20. That is, the coil 51 is overlapped with the polishing table 30 and the holding unit 20 when viewed from above. The coil 51 is overlapped with a part of the polishing table 30 and a part of the holding unit 20 when viewed from above. The coil 51 is not fixed to the polishing table 30, and thus, the position of the coil 51 is not changed even when the polishing table 30 is rotated. Therefore, the coil 51 generates the alternating magnetic field constantly in a position directly below the holding unit 20. Instead of such a configuration, another configuration may be taken in which the coil 51 is disposed in a position other than that directly below the holding unit 20. For example, the coil 51 does not overlapped with the polishing table 30 and/or the holding unit 20 when viewed from above. The coil 51 may be also configured to rotate with the polishing table 30.

The power supply 52 is an alternating-current power supply to generate and supply an alternating current to the coil 51.

When the substrate 100 is polished, the temperature raising unit 50 applies the alternating magnetic field to the polishing solution 60 supplied to the polishing cloth 32 to increase the temperature of the polishing solution 60. The reason and purpose that the temperature of the polishing solution 60 is increased by application of the alternating magnetic field will be described later.

FIG. 3 schematically illustrates a state where the substrate 100 is being polished by the polishing apparatus 10. As illustrated in FIG. 3, before the substrate 100 is polished, the holding unit 20 is moved downward so that the surface S to be polished of the substrate 100 is in contact with the polishing cloth 32. In this state, the holding unit 20 and the substrate 100 are rotated by the holding-unit driving device and the polishing table 30 and the polishing cloth 32 are rotated by the table driving device. As a result, the substrate 100 is moved relative to the polishing cloth 32 while being in contact with the polishing cloth 32.

At this time, the polishing solution 60 is discharged from the nozzle 41 of the supply unit 40 and is supplied to the upper surface of the polishing cloth 32. While the polishing solution 60 spreads along the upper surface of the polishing cloth 32, a part of the polishing solution 60 enters between the substrate 100 and the polishing cloth 32. The abrasive grains and the like contained in the polishing solution 60 then chemically and mechanically polishes the surface S to be polished of the substrate 100.

A pressure applied to the substrate 100 by the polishing cloth 32 during polishing is preferably 100 hPa or greater and 500 hPa or less, for example. Each rotation speed of the holding unit 20 and the polishing table 30 is preferably 30 rpm or greater and 120 rpm or less, for example.

Figure 4:
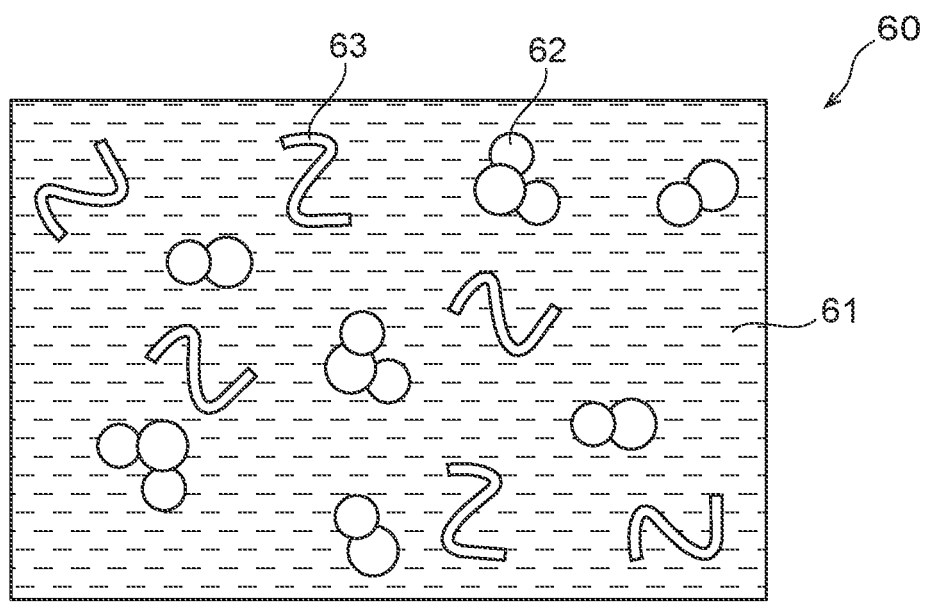
FIG. 4 a schematic view illustrating a polishing solution.

As described above, the polishing solution 60, which is also referred to as "slurry", is supplied onto the polishing cloth 32 during polishing. FIG. 4 schematically illustrates particles and other components contained in the polishing solution 60. As illustrated in FIG. 4, the polishing solution 60 contains a chemical solution 61, an abrasive grain 62, and a polymer 63.

The chemical solution 61 is a liquid containing, for example, a chemical component that modifies the object to be polished. For example, the chemical solution 61 contains a water-soluble polymer, an oxidizing agent, a surface-active agent, a nitrogen-containing heterocyclic compound, and a pH adjuster, in water, which is a liquid medium, as necessary. The water is preferably pure water, for example. The chemical solution 61 preferably contains at least one of a water-soluble polymer, an oxidizing agent, a surface-active agent, a nitrogen-containing heterocyclic compound, and a pH adjuster.

Examples of the available water-soluble polymer include polycarboxylic acid, polyacrylic acid, polymaleic acid, and a copolymer thereof. Containing such a water-soluble polymer in the chemical solution 61 may allow reduction in polishing friction.

Examples of the available oxidizing agent include ammonium persulfate, hydrogen peroxide, potassium hypochlorite, ozone, potassium periodate, and peracetic acid. Containing such an oxidizing agent in the chemical solution 61 allows creation of a fragile modified layer on the surface to be polished, which may facilitate polishing.

Examples of the available surface-active agent include an anionic surface-active agent, a cationic surface-active agent, and a nonionic surface-active agent. Containing such a surface-active agent in the chemical solution 61 may allow the chemical solution 61 to have appropriate viscosity.

Examples of the available nitrogen-containing heterocyclic compound include aziridine, pyridine, pyrimidine, pyrrolidine, piperidine, pyrazine, triazine, pyrrole, imidazole, indol, quinoline, isoquinoline, benzoisoquinoline, purine, pteridine, triazole, triazolidine, benzotriazole, and carboxybenzotriazole. A derivative having any skeleton of these compounds is also available. Containing such a nitrogen-containing heterocyclic compound in the chemical solution 61 may allow suppression of excessive etching and prevention of surface roughness after polishing.

Examples of the available pH adjuster include an inorganic acid such as phosphoric acid, sulfuric acid, hydrochloric acid, and nitric acid, and a salt thereof. Containing such a pH adjuster in the chemical solution 61 allows adjustment of the chemical solution 61 to have an appropriate pH value such that the polishing solution 60 can provide the performance.

The abrasive grain 62 is a particle used for mechanically polishing the object to be polished. In the present embodiment, an iron oxide is used as the abrasive grain 62. Examples of the available iron oxide may include $Fe_3O_4$ and $\gamma$-$Fe_2O_3$. As is well known, the iron oxide is a magnetic particle. Therefore, when an alternating magnetic field is applied from the outside by the temperature raising unit 50, the abrasive grain 62, which is an iron oxide, generates heat due to the relaxation of the magnetic moment. The abrasive grain 62 having such a property corresponds to the "exothermic agent" in the present embodiment. The abrasive grain 62 is preferably prepared by a common coprecipitation method to have a particle size of several tens of nanometers to several hundreds of nanometers.

The polymer 63 is a polymer containing an alkylcellulose represented by the following general formula (1). In formula (1), "R" represents a side chain and n represents an arbitrary integer. Examples of the alkylcellulose include methyl cellulose and hydroxypropyl methyl cellulose.

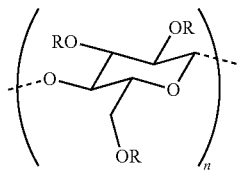

Increase in temperature of such a polymer 63 causes the molecules to approach each other due to thermal energy, and the hydrophobic interaction then occurs between the side chains of the approached molecules. As a result, the viscosity of the polishing solution 60 containing the polymer 63 increases. In other words, the polymer 63 undergoes a reversible phase transition between a gel state and a sol state depending on temperature, and the viscosity of the polishing solution 60 thereby changes. It may be thus described that the polymer 63 increases the viscosity of the polishing solution 60 with increasing temperature. The polymer 63 having such a property corresponds to the "viscosity modifier" in the present embodiment. Examples of the side chain represented by "R" in formula (1) include a methyl group, a propyl group, and a carboxyl group.

In the chemical-mechanical polishing, excessive friction between the object to be polished and the polishing cloth 32 may create local scratches on the surface of the object to be polished. According to the experiments and the like conducted by the present inventors, it has been found that increased viscosity of the polishing solution 60 can suppress the above-mentioned scratches.

However, when the polishing solution 60 having an increased viscosity is adopted, a problem arises in that the polishing solution 60 is difficult to be supplied from the supply unit 40. To secure the flow rate of the polishing solution 60 in such a case, for example, the air pressure to push out the polishing solution 60 needs to be set high, which requires a costly capital investment.

Accordingly, in the present embodiment, the viscosity of the polishing solution 60 is kept low when supplied from the supply unit 40 and is changed to be higher after supplied to the polishing cloth 32 to solve the above-mentioned problem.

Specifically, the temperature raising unit 50 applies an alternating magnetic field to the polishing solution 60 on the polishing cloth 32. When the alternating magnetic field is applied to the polishing solution 60, the abrasive grains 62, which is the exothermic agent, generates heat and the temperature of the polishing solution 60 containing the polymer 63 is increased. As described above, the viscosity of the polishing solution 60 is thus increased.

Figure 5:
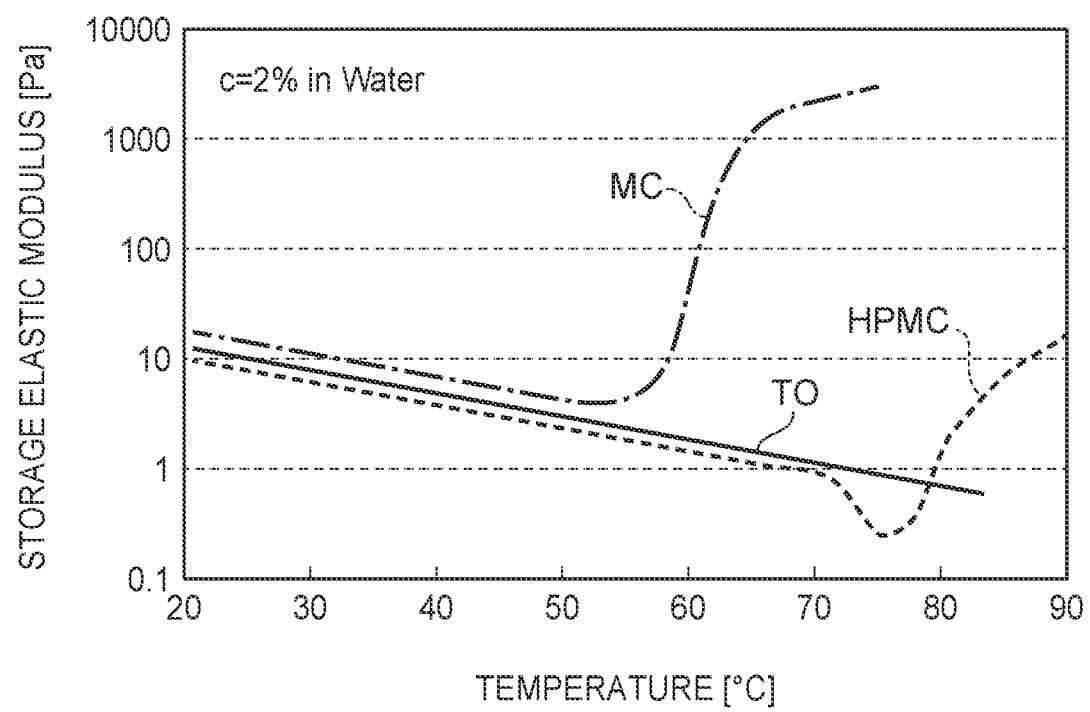
FIG. 5 is a graph for describing a relationship between temperature and viscosity of the polishing solution.

FIG. 5 shows changes in storage elastic modulus relative to temperature for aqueous solutions of methyl cellulose (MC) and hydroxypropyl methyl cellulose (HPMC) as examples of the alkylcellulose contained in the polymer 63 of the polishing solution 60. As shown in FIG. 5, the storage elastic modulus of methylcellulose (MC) is about 10 Pa at normal temperatures (around 25° C.) and decreases as the temperature increases similarly to common organic polymers, although it increases at a certain temperature (55° C.) and reaches 2000 Pa or greater at around 75° C. Similarly, the storage elastic modulus of hydroxypropyl methyl cellulose (HPMC) is about 10 Pa at normal temperatures (around 25° C.) and decreases as the temperature increases, although it increases at a certain temperature (75° C.) and reaches 20 Pa or greater at around 90° C. The dynamic elastic modulus, which is a physical quantity that describes viscoelasticity of an object, is expressed as a complex elastic modulus. The storage elastic modulus is the real part of the complex elastic modulus and corresponds to viscosity. As indicated with TO in FIG. 5, the storage elastic modulus (viscosity) of a common organic polymer linearly decreases as the temperature increases.

The above-mentioned change in viscosity of the alkylcelluloses is caused by the sol-gel phase transition depending on temperature. As described above, each alkylcellulose has a storage elastic modulus of about 10 Pa at normal temperatures (around 25° C.) because of being in the sol state. The increase in viscosity of the alkylcelluloses with increasing temperature is caused by the phase transition from the sol state to the gel state. In this way, the organic polymer that undergoes the reversible phase transition between the gel state and the sol state depending on the temperature is adopted as an additive to the polishing solution 60, and the viscosity of the polishing solution 60 can thereby be adjusted depending on the usage conditions of the polishing solution 60.

When the temperature of the polishing solution 60 containing the polymer 63 increases, the viscosity of the polishing solution 60 increases at least between the substrate 100 and the polishing cloth 32, which decreases the friction between the substrate 100 and the polishing cloth 32. As a result, local scratches on the surface of the substrate 100 is more suppressed than previously possible.

As described above, according to the polishing apparatus 10 of the present embodiment, the viscosity of the polishing solution 60 is kept low in the supply unit 40 so that the polishing solution 60 can be supplied at a sufficient flow rate even with a low air pressure, while the viscosity of the polishing solution 60 is increased on the polishing cloth 32. Consequently, local scratches on the surface of the substrate 100 can be suppressed.

As a method for increasing the temperature of the polishing solution 60 on the polishing cloth 32, another method is conceivable, for example, in which the temperature of the polishing table 30 is increased with a heater or the like, instead of the above-mentioned method. In other words, a method is also conceivable in which the polishing solution 60 is heated via the polishing table 30 and the polishing cloth 32. However, such a method may cause another problem.

Figure 6:
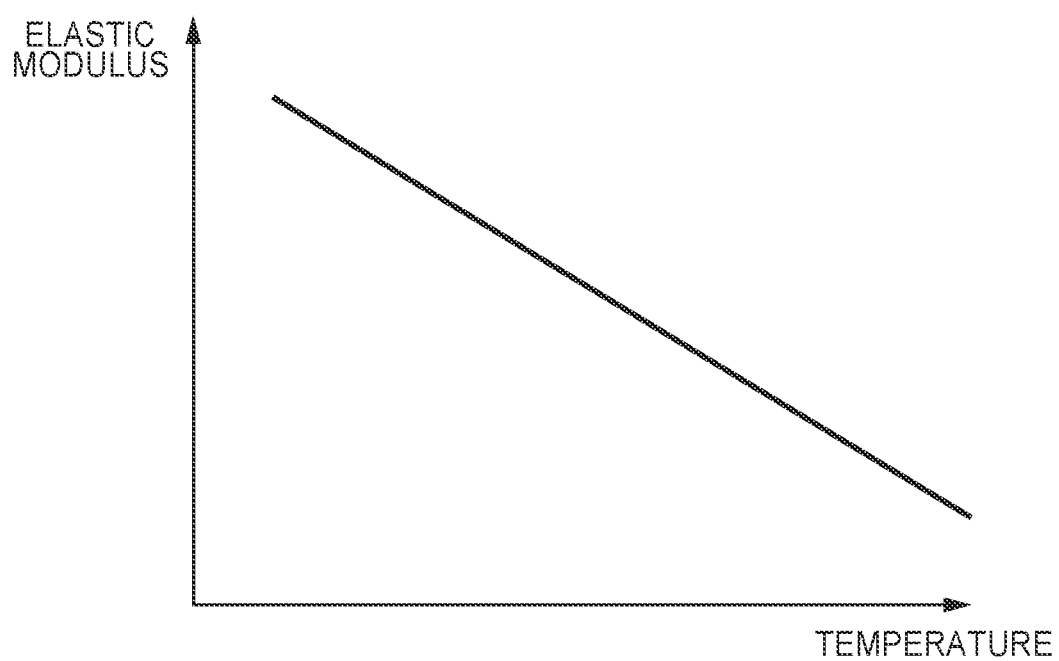
FIG. 6 is a graph showing a relationship between temperature and elastic modulus of a polishing cloth.

FIG. 6 schematically shows a relationship between the temperature of the polishing cloth 32 (horizontal axis) and the elastic modulus of the polishing cloth 32 (vertical axis). As shown in FIG. 6, the polishing cloth 32 has a property that its elastic modulus decreases as the temperature increases.

Figure 7A:
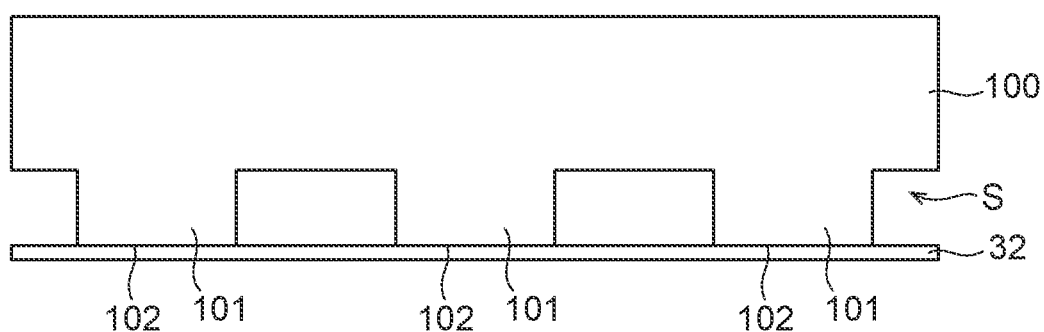
FIGS. 7A and 7B are each views for describing a problem occurring when the elastic modulus of the polishing cloth changes.

FIG. 7A schematically illustrates the polishing cloth 32 during polishing when the temperature of the polishing cloth 32 is low (for example, 15° C. or higher and 30° C. or lower) and the elastic modulus of the polishing cloth 32 is therefore relatively high, for example, 250 MPa or greater and 350 MPa or less. The reference numeral "101" in FIG. 7A indicates a convex portion formed on the surface S to be polished of the substrate 100. Hereinafter, the convex portion is also referred to as "convex portion 101", and the end surface of the convex portion 101 is also referred to as "end surface 102".

As illustrated in FIG. 7A, when the elastic modulus of the polishing cloth 32 is relatively high, the shape of the polishing cloth 32 does not follow that of the surface S to be polished and is entirely kept generally flat. In the substrate 100, the end surface 102 of the convex portion 101 is thus preferentially and uniformly polished. As a result, the flattening performance of the polishing apparatus 10 is sufficiently provided.

Figure 7B:
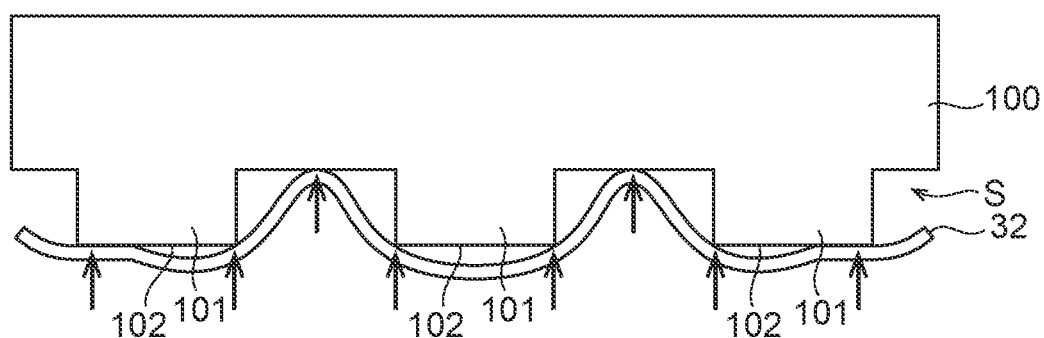

FIG. 7B schematically illustrates the polishing cloth 32 during polishing when the temperature of the polishing cloth 32 is high (for example, 55° C. or higher and 70° C. or lower) and the elastic modulus of the polishing cloth 32 is therefore relatively low, for example, 50 MPa or greater and 150 MPa or less. As described above, when the polishing solution 60 is heated via the polishing cloth 32, the polishing cloth 32 has a high temperature as in this case.

As illustrated in FIG. 7B, when the elastic modulus of the polishing cloth 32 is relatively low, the shape of the polishing cloth 32 follows that of the surface S to be polished. As illustrated in FIG. 7B, in case of such following by the polishing cloth 32, the polishing cloth 32 may be not in contact with the entire end surface 102 but locally in contact with only a part of the end surface 102. Also, the deformed polishing cloth 32 may partially get into contact with an area around the convex portion 101 (that is, a concave portion). In FIG. 7B, the areas with which the polishing cloth 32 may get into contact are indicated with arrows.

In this case, the substrate 100 is polished also including the areas other than the convex portions 101. Therefore, when the polishing solution 60 is heated via the polishing cloth 32 with a heater or the like, the flattening performance of the polishing apparatus 10 may not be sufficiently provided.

In the polishing apparatus 10 according to the present embodiment, the polishing solution 60 on the polishing cloth 32 generates heat by the alternating magnetic field applied by the temperature raising unit 50. In this case, a temperature increase of the polishing cloth 32 required to bring the polishing solution 60 to a desired temperature can be decreased compared to that in heating the polishing solution 60 via the polishing cloth 32 as described above, and the problem of the decrease in elastic modulus of the polishing cloth 32 is therefore hard to occur. As a result, the present embodiment makes it possible to suppress local scratches on the surface of the substrate 100 while the flattening performance of the polishing apparatus 10 is sufficiently ensured.

Figure 8:
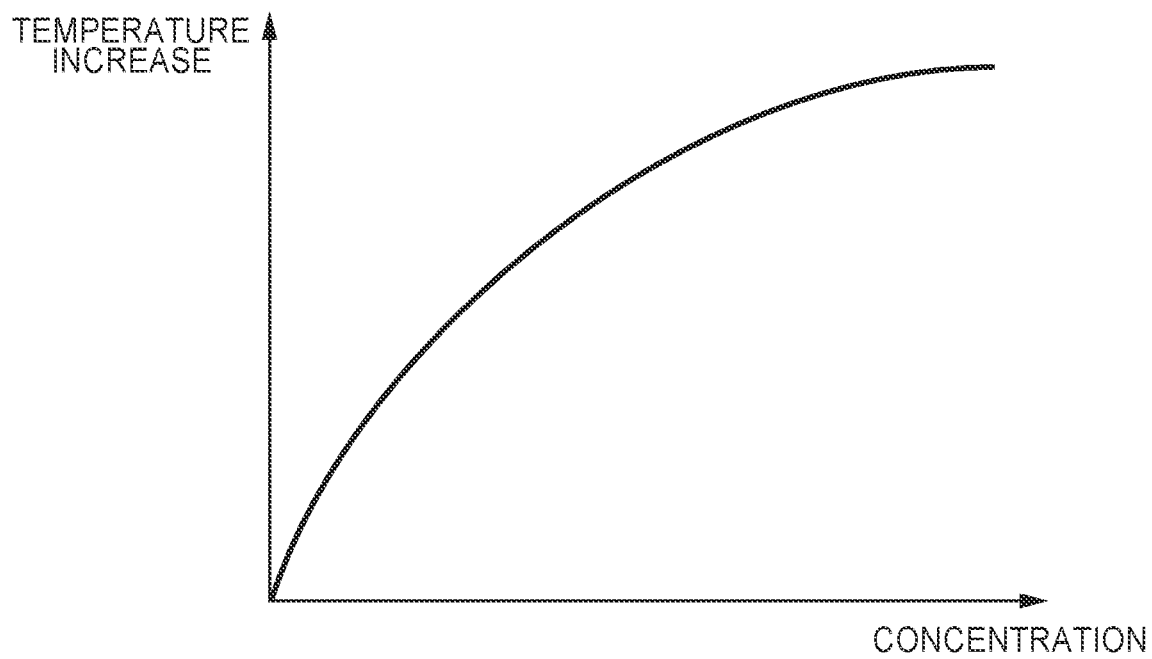
FIG. 8 is a graph showing a relationship between concentration of an exothermic agent contained in the polishing solution and temperature increase of the polishing solution.

FIG. 8 schematically shows a relationship between the concentration of the abrasive grain 62 in the polishing solution 60 (horizontal axis) and the temperature increase of the polishing solution 60 when an alternating magnetic field is applied (vertical axis). Such a correspondence can be obtained in advance, for example, through experiments. The concentration of the abrasive grain 62 may be appropriately determined based on such a correspondence.

A polishing method executed by the polishing apparatus 10 includes a holding step, a magnetic-field application step, and a polishing step. As illustrated in FIG. 2, the holding step is a step to hold the substrate 100, which is the object to be polished, by the holding unit 20. As illustrated in FIG. 3, the magnetic-field application step is a step to supply the polishing solution 60 to the polishing cloth 32 and apply an alternating magnetic field to the polishing solution 60. The polishing step is a step to bring the upper surface of the polishing cloth 32 into contact with the substrate 100 to polish the substrate 100. Such a polishing method may be adopted not only for polishing a silicon wafer such as the substrate 100, but also for polishing other objects.

FIG. 9 shows a plurality of examples of specific procedures of polishing by the polishing apparatus 10. Each flowchart in FIG. 9 shows a flow of a process executed after the holding step is completed.

Figure 9C:
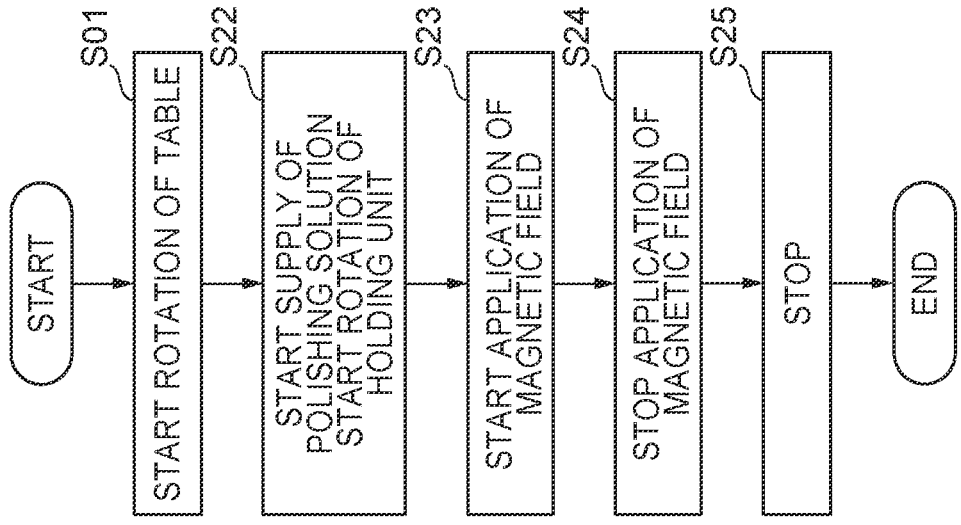
FIGS. 9A, 9B, and 9C are each flowcharts showing an example of a specific procedure of polishing.
Figure 9B:
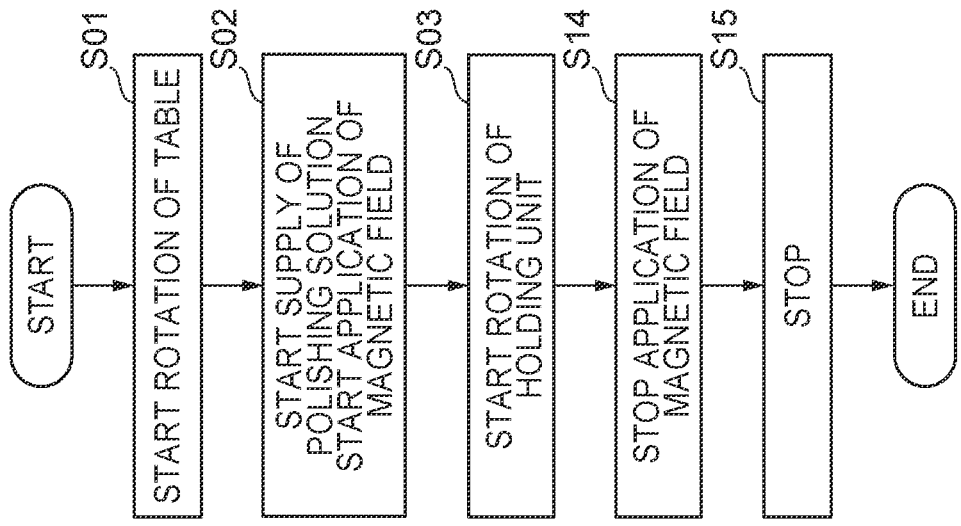
Figure 9A:
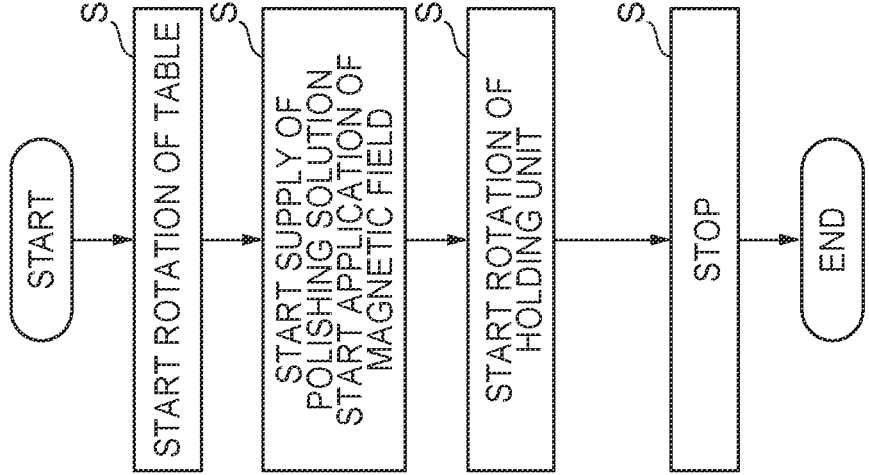

As for an example shown in FIG. 9A, in S01 executed following the holding step, the rotation of the polishing table 30 is started. In S02 following S01, the supply of the polishing solution 60 from the supply unit 40 is started, and the application of the alternating magnetic field by the temperature raising unit 50 is started to the polishing solution 60 supplied to the polishing cloth 32. That is, the above-mentioned magnetic-field application step is started.

In S03 following S02, the rotation of the holding unit 20 is started. At this time, the substrate 100 has been brought into contact with the upper surface of the polishing cloth 32 in advance. Alternatively, after the rotation of the holding unit 20 is started, the substrate 100 may be brought into contact with the upper surface of the polishing cloth 32. In S03, the above-mentioned polishing step is thus started. From and after S03, the substrate 100 is polished by the polishing solution 60 having an increased viscosity.

After the substrate 100 is sufficiently polished, the process proceeds to S04 and the polishing is stopped. In S04, the rotation of the polishing table 30 is stopped, the supply of the polishing solution 60 from the supply unit 40 is stopped, the application of the alternating magnetic field by the temperature raising unit 50 is stopped, and the rotation of the holding unit 20 is stopped.

Polishing by the polishing apparatus 10 may be performed in a different order from that shown in FIG. 9A. In an example shown in FIG. 9B, S01 to S03 are common with FIG. 9A. In this example, after a predetermined period of time has elapsed from the start of the polishing of the substrate 100 in S03, the process proceeds to S14. In S14, the application of the alternating magnetic field by the temperature raising unit 50 is stopped. The substrate 100 is continuously polished. From and after S14, as the temperature of the polishing solution 60 gradually decreases, the viscosity of the polishing solution 60 also gradually decreases. Therefore, the substrate 100 is polished with the friction between the substrate 100 and the polishing cloth 32 being higher than before. In the example of FIG. 9B, the application of the alternating magnetic field by the temperature raising unit 50 is stopped at a predetermined timing, and the polishing conditions can thereby be adjusted.

After the substrate 100 is sufficiently polished, the process proceeds to S15, and the polishing is stopped. In S15, the rotation of the polishing table 30 is stopped, the supply of the polishing solution 60 from the supply unit 40 is stopped, and the rotation of the holding unit 20 is stopped.

Another example will be described. In an example shown in FIG. 9C, S01 is common with FIG. 9A. In this example, in S22 following S01, the supply of the polishing solution 60 from the supply unit 40 is started, and the rotation of the holding unit 20 is started. After or before the start of the rotation, the substrate 100 is brought into contact with the upper surface of the polishing cloth 32. The substrate 100 is thus polished from and after S22. In S22, the alternating magnetic field is, however, not applied by the temperature raising unit 50. Therefore, the temperature of the polishing solution 60 is not increased in S22, and the viscosity of the polishing solution 60 is still low.

After a predetermined period of time has elapsed from the start of the polishing of the substrate 100 in S22, the process proceeds to S23. In S23, the application of the alternating magnetic field by the temperature raising unit 50 is started to the polishing solution 60 supplied to the polishing cloth 32. From and after S23, as the temperature of the polishing solution 60 gradually increases, the viscosity of the polishing solution 60 also gradually increases. Therefore, the substrate 100 is polished with the friction between the substrate 100 and the polishing cloth 32 being lower than before. In the example of FIG. 9C, the application of the alternating magnetic field by the temperature raising unit 50 is started at a predetermined timing, and the polishing conditions can thereby be adjusted.

After the substrate 100 is sufficiently polished, the process proceeds to S24, and the application of the alternating magnetic field by the temperature raising unit 50 is stopped. In S25 following S24, the rotation of the polishing table 30 is stopped, the supply of the polishing solution 60 from the supply unit 40 is stopped, and the rotation of the holding unit 20 is stopped. Alternatively, S24 and S25 may be executed at the same time.

In the present embodiment, an iron oxide is used as the material of the abrasive grain 62. Accordingly, the abrasive grain 62 has both a function as an abrasive grain to perform mechanical polishing and a function as an exothermic agent to generate heat under application of the alternating magnetic field. Instead of such an aspect, an exothermic agent may be added as a separate material from the abrasive grain.

When being a magnetic particle as in the present embodiment, the abrasive grain 62 is easy to adhere to the substrate 100, which is a silicon wafer, and a benefit is consequently gained in which the polishing rate is improved. The abrasive grain 62 may contain not only an iron oxide but also other materials. For example, a particle in which an iron oxide is surrounded by silicon oxide may be used as the abrasive grain 62.

In the present embodiment, the polymer 63 is used as a viscosity modifier. A material different from that of the present embodiment may be used as a viscosity modifier. Further, a plurality of materials, including the polymer 63 of the present embodiment, may be used as viscosity modifiers.

The present embodiment has been described with reference to the specific examples. However, the present disclosure is not limited to the specific examples. Any design modification applied to such specific examples by a person skilled in the art is also encompassed within the scope of the present disclosure, as long as such modification has the features of the present disclosure. For example, the components included in the above-mentioned specific examples, as well as the arrangements, conditions, and shapes thereof are not limited to those illustrated herein, but can be appropriately modified. The combination of the components included in the above-mentioned specific examples can be appropriately changed, as long as such changes do not lead to any technical inconsistencies.

What is claimed is:

1. A polishing method, comprising:
   holding an object to be polished;
   starting supply of a polishing solution to an upper surface of a polishing cloth, and starting application of an alternating magnetic field to the polishing solution, wherein the polishing solution comprises:
   an exothermic agent that generates heat through the application of the alternating magnetic field to the polishing solution; and
   a viscosity modifier that undergoes a reversible phase transition between a gel state and a sol state depending on temperature; and
   bringing the object to be polished into contact with the upper surface of the polishing cloth to start polishing of the object to be polished.

2. The polishing method according to claim 1, wherein viscosity of the polishing solution is lower when the polishing solution is supplied than the viscosity of the polishing solution when the object is polished.

3. The polishing method according to claim 2, wherein, after the supply of the polishing solution and the application of the alternating magnetic field to the polishing solution are started, rotation of the object to be polished is started.

4. The polishing method according to claim 2, wherein, after the supply of the polishing solution and the rotation of the object to be polished are started, the application of the alternating magnetic field to the polishing solution is started.

5. The polishing method according to claim 2, wherein, after the polishing of the object to be polished is started, the supply of the polishing solution, the application of the alternating magnetic field to the polishing solution, and the rotation of the object to be polished are stopped.

6. The polishing method according to claim 2, wherein
   after the polishing of the object to be polished is started, the application of the alternating magnetic field to the polishing solution is stopped, and
   after the application of the alternating magnetic field to the polishing solution is stopped, the supply of the polishing solution and the rotation of the object to be polished are stopped.

* * * * *